(12) United States Patent
Satou

(10) Patent No.: US 6,268,112 B1
(45) Date of Patent: Jul. 31, 2001

(54) PHOTOSENSITIVE RESIN COMPOSITION

(75) Inventor: Hiroaki Satou, Ibaraki (JP)

(73) Assignee: The Nippon Synthetic Chemical Industry Co., Ltd., Osaka-Fu (JP)

(*) Notice: Subject to any disclaimer, the term of this patent is extended or adjusted under 35 U.S.C. 154(b) by 0 days.

(21) Appl. No.: 09/212,265

(22) Filed: Dec. 16, 1998

(30) Foreign Application Priority Data

Dec. 18, 1997 (JP) ................................... 9-365136
Dec. 18, 1997 (JP) ................................... 9-365137
Dec. 18, 1997 (JP) ................................... 9-365138

(51) Int. Cl.$^7$ .............................. G03F 7/038; G03F 7/11
(52) U.S. Cl. ........................ 430/284.1; 522/93; 522/97; 430/920
(58) Field of Search .................... 430/284.1; 522/93, 522/97

(56) References Cited

U.S. PATENT DOCUMENTS

| | | | |
|---|---|---|---|
| 4,153,778 | * | 5/1979 | Park et al. ........................ 528/76 |
| 4,877,711 | * | 10/1989 | Aoai et al. ..................... 430/284.1 |
| 5,415,972 | * | 5/1995 | Mayes ........................... 430/284.1 |

FOREIGN PATENT DOCUMENTS

| | | |
|---|---|---|
| 62-924 | 1/1987 | (JP). |
| 2-10165 | 3/1990 | (JP). |
| 3-6202 | 1/1991 | (JP). |
| 7-219224 | 8/1995 | (JP). |
| 7-248621 | 8/1995 | (JP). |
| 8-54734 | 2/1996 | (JP). |
| 8-305017 | 11/1996 | (JP). |
| 9-152713 | 6/1997 | (JP). |

OTHER PUBLICATIONS

Monroe, Bruce and Weed, Greogory C., "Photoinitiators for Free–Radical–Initiated Photoimaging Systems", Chemical Reviews, 1993, vol. 93, No. 1, pp. 435–448.*

* cited by examiner

Primary Examiner—Cynthia Hamilton
(74) Attorney, Agent, or Firm—Leydig, Voit & Mayer, Ltd.

(57) ABSTRACT

A photosensitive resin composition including a particular acrylic-urethane resin containing a carboxyl group and an acrylic-urethane resin having a particular segment in a combined manner and containing a photo-polymerization initiator achieves superior sensitivity, resolution, chemical resistance to developer, sandblasting resistance, and stability.

19 Claims, 1 Drawing Sheet

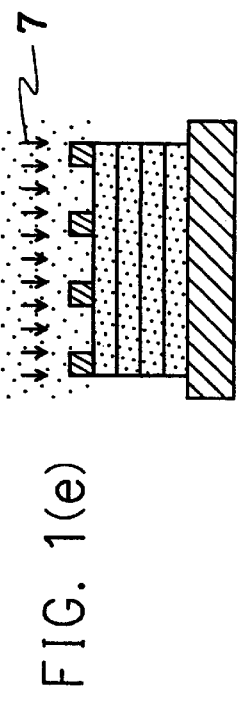
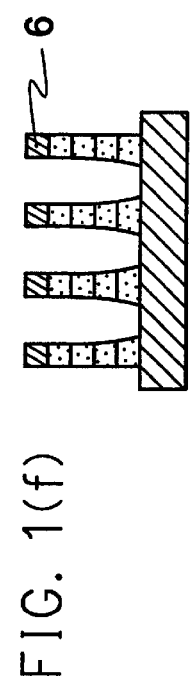
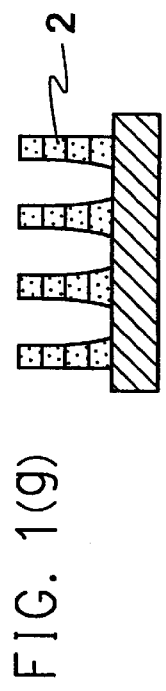
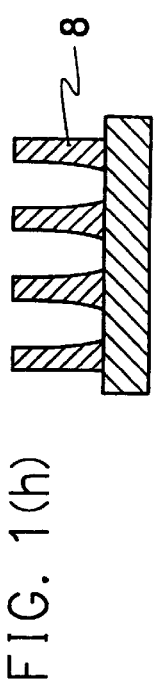
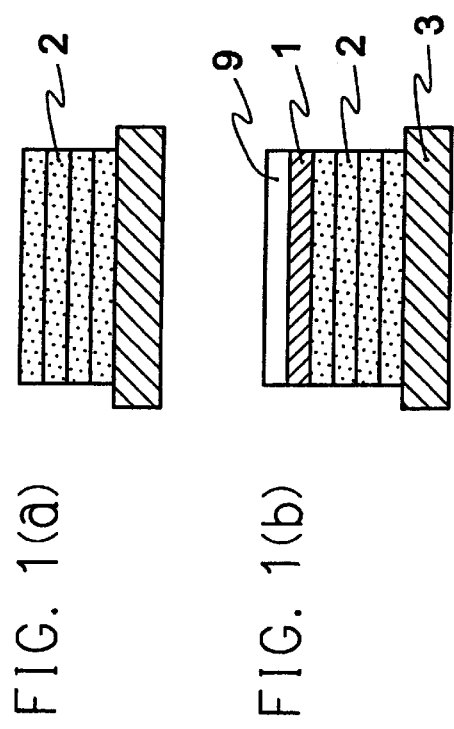
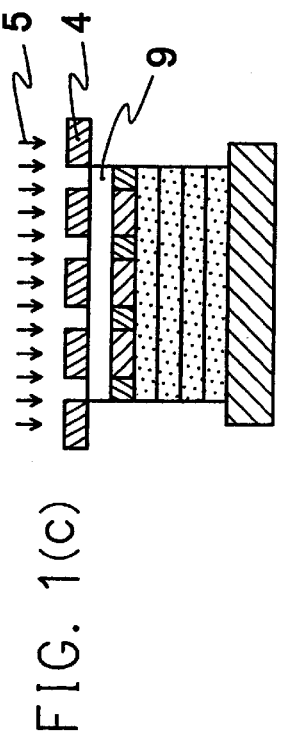
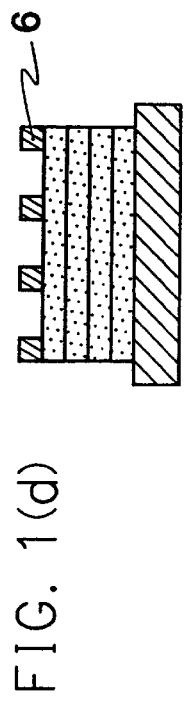

PHOTOSENSITIVE RESIN COMPOSITION

BACKGROUND OF THE INVENTION

The present invention relates to a photosensitive resin composition, and more particularly a photosensitive composition which is superior in chemical resistance for developer, resolution, sandblasting resistance, and stability, and is suitable for use in dry film resist.

A laminated film with three layers, in which a photosensitive resin composition is applied on a base film such as a polyester film, dried and formed as a layer, and a protective film such as a polyethylene film or a polyvinylalcohol film is stacked thereon, is generally referred to as a dry film photoresist (hereinafter, referred to as DFR). The film has been widely used in manufacturing processes for printed circuit boards, precision machining processes for metals, etc.

Upon application of such a film, first, either the base film or the protective film, which exhibits the weaker adhesion, is separated and removed from the DFR, and the side bearing the photosensitive resin composition layer is affixed onto the surface of a base substrate, such as a copper surface of a copper laminated substrate, on which a pattern is to be formed. Then this is subjected to exposure with a pattern mask being in contact with the film on the other side (in some cases, exposure is applied after the film on the other side has been removed). And the other film is separated and removed, and then subjected to a developing process. As for developing systems after exposure, there are those of the solvent-developing type and the diluted alkali developing type.

Besides DFRs, another method has been well-known, in which a photosensitive resin composition is directly applied on the surface of a base substrate and formed as a film, and a pattern mask is made in contact therewith, with a film such as a polyester film interpolated in between, and then exposure is applied thereto.

In recent years, a sandblast method using a DFR has been used for forming a barrier rib in a plasma display panel, etc.

With respect to photosensitive resin compositions for DFRs used in such applications, the following compositions are, for example, listed: (1) a solid-state photo-polymerizable resin composition comprising a polymerizable crosslinking unsaturated acrylic urethane compound having an acid number in the range of 20 to 200 mgKOH/g prepared by a particular method, an alkali-soluble high polymer composition having a compatibility with the urethane compound, and a light sensitizer (Japanese Examined Patent Publication No. 924/1987 (Tokukousho 62-924)), (2) a photosensitive resin composition using a urethane prepolymer having a particular carboxyl-acrylic type terminal (Japanese Examined Patent Publication No. 10165/1990 (Tokukouhei 2-10165)), (3) a photo-polymerizable composition comprising a base polymer having an acid number in the range of 100 to 600 mgKOH/g and the average molecular weight in the range of 10000 to 500000, a polymerizable unsaturated compound containing 10 to 50% by weight of a compound having one polymerizable unsaturated group and 10 to 90% by weight of a compound having two polymerizable unsaturated groups, and a photo-polymerization initiator (Japanese Unexamined Patent Publication No. 6202/1991 (Tokukaihei 3-6202)), (4) a photosensitive resin composition containing specific amounts of the respective materials of a base polymer having an acid number in the range of 100 to 200 mg KOH/g and the average molecular weight in the range of 30000 to 120000, an ethylenically unsaturated compound, P,P'-bis(dialkylamino) benzophenone, hexaarylbiimidazole and a leuco dye, and also containing not less than 95% by weight of an ethylenically unsaturated compound having two polymerizable unsaturated groups in its compounds (Japanese Unexamined Patent Publication No. 248621/1995 (Tokukaihei 7-248621), (5) a photosensitive polymer composition containing a particular polymer having a carboxyl group and an amide bond, an unsaturated compound containing an amino group or its quaternary salt and 4,4'-diazide-3,3'-dimethoxybiphenyl (Japanese Unexamined Patent Publication No.219224/1995 (Tokukaihei 7-219224), (6) a photosensitive resin composition comprising a urethane compound containing a specific (meth)acrylate group terminal, an alkali-soluble high polymer compound having an acid number in the range of 50 to 250 mgKOH/g and a photo polymerization initiator (Japanese Unexamined Patent Publication No. 305017/1996 (Tokukaihei 8-305017)), (7) a photosensitive resin composition comprising a urethane (meth)acrylate compound modified with a carboxyl group that has not less than two (meth) acryloyl groups, an acid number in the range of 50 to 250 mgKOH/g, and Tg after cure in the range of 5 to 95° C., an alkali-soluble high polymer compound having an acid number in the range of 50 to 250 mgKOH/g and a photo-polymerization initiator (Japanese Unexamined Patent Publication No. 54734/1996 (Tokukaihei 8-54734), (8) a photosensitive resin composition comprising a urethane (meth)acrylate compound containing not less than two acryloyl groups, an alkali-soluble high polymer compound having an acid number in the range of 50 to 250 mgKOH/g, a high polymer compound having a thiocyanic alkali salt and a poly(alkylene oxide) segment, and a photo-polymerization initiator (Japanese Unexamined Patent Publication No. 152713/1997 (Tokukaihei 9-152713).

However, in the sandblast method, the following properties are required: chemical resistance for developer (fine line adhesion after development), sandblasting resistance (fine line adhesion after sandblasting), and stability in forming DFRs (changes in color tones, deterioration in resolution and adhesion, etc.) and so on. In the case of the above-mentioned (1), (6), (7) and (8), the sandblasting resistance comparatively satisfied, but these pose problems in alkali property cause an insufficient resolution, and require a strict management in the density of a developing liquid and developing time upon developing (narrower latitude). In the case of the above-mentioned (2), (3) and (4), the resolution and chemical resistance for developer are comparatively satisfied, but the sandblasting resistance is insufficient. In (3) and (4) the resist after cure is not flexible, and the sandblasting resistance is insufficient. In (5), the resolution is not sufficient, the stability of the photo dope (a solution of photosensitive resin composition) and DFRs using it is insufficient, and the sandblasting resistance is inferior; therefore, more improvements are required to apply it to the sandblast method.

Moreover, in the sandblasting of SiC substrates which requires blasting powder with high hardness at high pressure, none of the above-mentioned resin compositions are successfully applied to practical use, and resin compositions for DFRs having a higher sandblasting resistance have been demanded.

SUMMARY OF THE INVENTION

In order to solve the above-mentioned problems, after earnest research and study, inventors of the present invention have found that a photosensitive resin composition comprising an acrylic-urethane resin containing a carboxyl group (A) represented by the following formula (1) which has an acid number in the range of 10 to 100 mgKOH/g, an acrylic-urethane resin (B) selected from the group consisting of an acrylic-urethane resin (B1) represented by the following formula (3), an acrylic-urethane resin (B2) represented by the following formula (5), an acrylic-urethane resin (B3) represented by the following formula (6), and a photopolymerization initiator (C), is provided with a high resolution, and is superior in chemical resistance for developer, sandblasting resistance and stability in DFRs, etc.

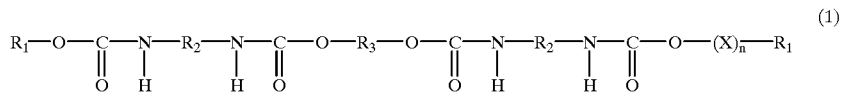

(1)

(wherein X represents a structure represented by the following formula (2), $R_1$ represents a urethane-bond remaining group of a compound having one or two ethylenically unsaturated groups and one hydroxyl group, $R_2$ represents both ends of urethane-bond remaining groups of diisocyanate compound, $R_3$ represents both ends of urethane remaining groups of 2,2-bis(hydroxymethyl)propionic acid or 2,2-bis(hydroxymethyl)butanoic acid, and n represents a positive integer of not more than 20.)

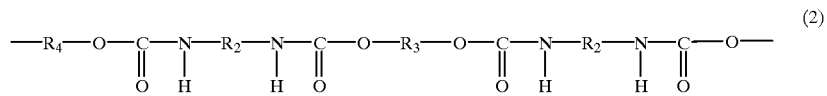

(2)

(wherein $R_4$ represents polyol or polyester polyol having the average molecular weight of 500 to 10000, and $R_2$ and $R_3$ respectively represent the same remaining groups as defined above.)

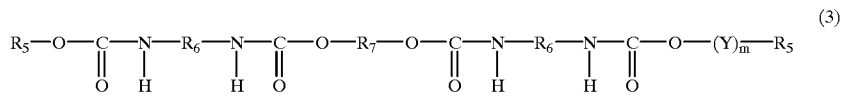

(3)

(wherein Y represents a structure represented by the following formula (4), $R_5$ represents a urethane-bond remaining group of a compound having not less than one ethylenically unsaturated groups and one hydroxyl group, $R_6$ represents both ends of urethane-bond remaining groups of diisocyanate compound, $R_7$ represents a urethane-bond remaining group of a polyol compound having a molecule weight of not more than 200 with no acid number, and m represents a positive integer of not more than 20.)

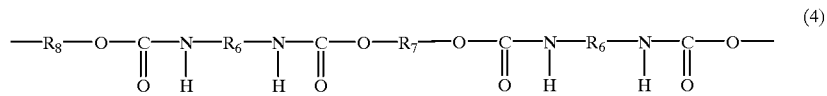

(4)

(wherein $R_8$ represents polyol or polyester polyol having the average molecular weight of 500 to 10000, and $R_6$ and $R_7$ respectively represent the same remaining groups as defined above.)

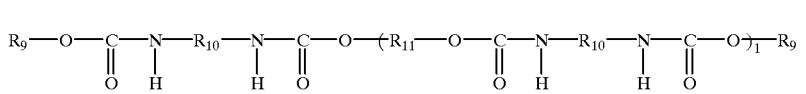
(5)

(wherein $R_9$ represents a urethane-bond remaining group of a compound having not less than one ethylenically unsaturated group and one hydroxyl group, $R_{10}$ represents both ends of urethane-bond remaining groups of diisocyanate compound, $R_{11}$ represents polyol or polyester polyol having the average molecular weight of 500 to 10000, and l represents a positive integer of not more than 20.)

an insufficient flexibility and a degradation in blasting resistance, thereby failing to achieve the object of the present invention.

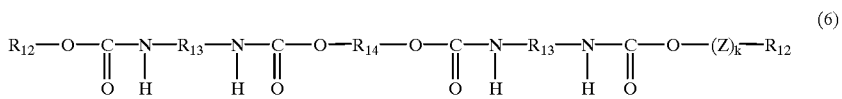
(6)

(wherein Z represents a structure represented by the following formula (7), $R_{12}$ represents a urethane-bond remaining group of a compound having not less than three ethylenically unsaturated groups and one hydroxyl group, $R_{13}$ represents both ends of urethane-bond remaining groups of diisocyanate compound, $R_{14}$ represents both ends of urethane remaining groups of 2,2-bis(hydroxymethyl) propionic acid or 2,2-bis(hydroxymethyl) butanoic acid, and k represents a positive integer of not more than 20.)

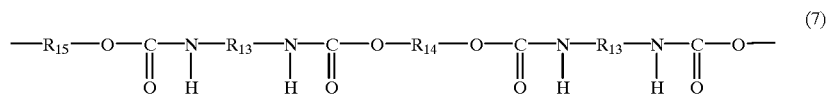
(7)

(wherein $R_{15}$ represents polyol or polyester polyol having the average molecular weight of 500 to 10000, and $R_{13}$ and $R_{14}$ respectively represent the same remaining groups as defined above.)

BRIEF EXPLANATION OF THE DRAWINGS

FIGS. 1(a)–1(h) show a method for forming a barrier rib in a plasma display panel by the sandblast method using the photosensitive resin composition of the present invention.

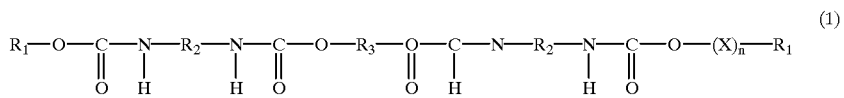
(1)

DETAILED DESCRIPTION

The acrylic-urethane resin (A) containing a carboxyl group of the present invention is an acrylic-urethane resin (A) containing a carboxyl group represented by the following formula (1) which has an acid number in the range of 10 to 100 mgKOH/g.

When the acid number is less than 10 mgKOH/g, it is impossible to obtain a sufficient developing property. On the other hand, the acid number beyond 100 mgKOH/g causes (wherein X represents a structure represented by the following formula (2), $R_1$ represents a urethane-bond remaining group of a compound having one or two ethylenically unsaturated groups and one hydroxyl group, $R_2$ represents both ends of urethane-bond remaining groups of diisocyanate compound, $R_3$ represents both ends of urethane remaining groups of 2,2-bis(hydroxymethyl)propionic acid or 2,2-bis(hydroxymethyl)butanoic acid, and n represents a positive integer of not more than 20.)

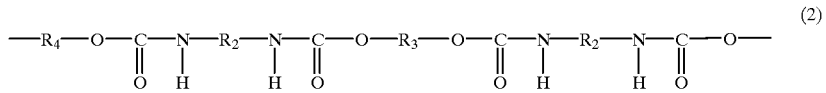

(2)

(wherein $R_4$ represents polyol or polyester polyol having the average molecular weight of 500 to 10000, and $R_2$ and $R_3$ respectively represent the remaining groups in the same manner as described above.) There is no particular limitation for the preparation method of the above-mentioned acrylic-urethane resin (A) containing a carboxyl group (A), and for example, when n=2 in formula (1), 6 moles of isocyanate (2,4- or 2,6-tolylene diisocyanate, m- or p-xylylene diisocyanate, hydrogenated xylylene diisocyanate, diphenylmethane-4,4'-diisocyanate or its modified compound or polymer, hexamethylene diisocyanate, isophorone diisocyanate, 1,4-tetramethylene diisocyanate, naphthalene diisocyanate, etc.) and 3 moles of 2,2-bis(hydroxymethyl) propionic acid (BMPA) or 2,2-bis(hydroxymethyl) butanoic acid (BMBA) are allowed to react in a solvent (ethyl acetate, ethyl acetate/toluene mixture, ethyl acetate/2-butanone mixture, etc.) approximately at a temperature in the range of 50 to 95° C. under an inert gas atmosphere of nitrogen gas, etc. Next, to this is added 2 moles of polyol having the average molecule weight of 500 to 10000 (polyether polyol, polyester polyol, polycarbonate polyol, acryl polyol, polybutadiene polyol, polyolefin polyol, etc., more preferably, those having the average molecule weight of 500 to 4000), and the reaction is further continued. At a temperature in the range of about 50 to 75° C., to the mixture is added 2 moles of a compound having not less than one ethylenically unsaturated groups and one hydroxyl group (2-hydroxyethyl acrylate (2HEA), 2-hydroxyethyl methacrylate, 2-hydroxypropyl (meth)acrylate, etc.) is added, and the mixture is allowed to react to obtain an acrylic-urethane resin (A) containing a carboxyl group of the present invention. In the above-mentioned reaction there can be, of course, used an appropriate catalyst. And the above-mentioned number of moles to be reacted of each of the ingredients is shown in the case of n=2 in formula (1); and in the case of n=3, the numbers of moles to be reacted of the respective ingredients can be changed to 8 moles, 4 moles, 3 moles and 2 moles. In the other cases, the corresponding changes may be applied to produce the resin, but there is no particular limitation for these methods.

Thus, the acrylic-urethane resin (A) containing a carboxyl group can be obtained, but the acid number of the acrylic-urethane resin (A) containing a carboxyl group needs to be in the range of 10 to 100 mgKOH/g. If the acid number is less than 10 mgKOH/g it is impossible to develop unexposed portions effectively, resulting in a reduction in the resolution. On the other hand, the acid number beyond 100 mgKOH/g causes a degradation in chemical resistance for developer and sandblasting resistance, failing to achieve the object of the present invention. The acid number can be adjusted by controlling the numbers of moles of the above-mentioned reaction and the molecule weight of the polyol.

As the acrylic-urethane resin (B), there can be used an acrylic-urethane resin (B I) represented by the following formula (3):

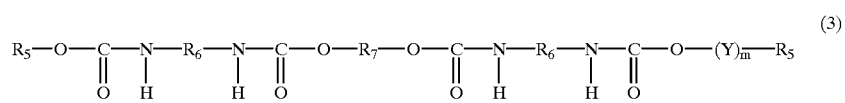

(3)

(wherein Y represents a structure represented by the following formula (4), $R_5$ represents a urethane-bond remaining group of a compound having not less than one ethylenically unsaturated g rou ps and on e hydroxyl group, R represents both ends of urethane-bond remaining groups of drisocyanate compound, $R_7$ represents a urethane-bond remaining group of a polyol compound having a molecule weight of not more than 200 with no acid number, and m represents a positive integer of not more than 20.)

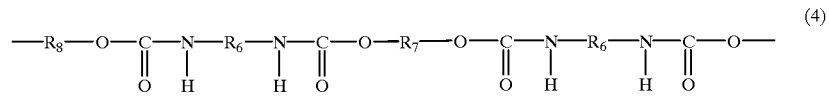

(4)

(wherein $R_8$ represents polyol or polyester polyol having the average molecular weight of 500 to 10000, and $R_6$ and $R_7$ respectively represent the same remaining groups as defined above.)

There is no particular limitation for the preparation method of the above-mentioned acrylic-urethane resin (B 1), but for example, when m=2 in formula (3), 6 moles of isocyanate (2,4- or 2,6-tolylene diisocyanate, m- or p-xylylene diisocyanate, hydrogenated xylylene diisocyanate, diphenylmethane-4,4'-diisocyanate or its modified compound or polymer, hexamethylene diisocyanate, isophorone diisocyanate, 1,4-tetramethylene diisocyanate, naphthalene diisocyanate, etc.) and 3 moles of a polyol compound having a molecular weight of no more than 200 with no acid number (neopentyl glycol, ethylene glycol, diethylene glycol, triethylene glycol, 1,2-propylene glycol, 1,3-propylene glycol, 1 ,3-butanediol, 1,4-butanediol, 1,5-pentanediol, 1,6-hexanediol, etc.) are allowed to react in a solvent (ethyl acetate, toluene, ethyl acetate/toluene mixture, ethyl acetate/2-butanone mixture, etc.) approximately at a temperature in the range of 50 to 95° C. under an inert gas atmosphere of nitrogen gas, etc. Next, to the mixture is added 2 moles of polyol having the average molecule weight of 500 to 10000 (polyether polyol, polyester polyol, polycarbonate polyol, acryl polyol, polybutadiene polyol, polyolefin polyol, etc., more preferably, those having the average molecule weight of 500 to 4000), and the reaction is further continued. At a temperature in the range of 50 to 80° C., 2 moles of a compound having not less than one ethylenically unsaturated groups and one hydroxyl group (2-hydroxyethyl acrylate (2HEA), 2-hydroxyethyl methacrylate, 2-hydroxypropyl (meth)acrylate, etc.) is added, and the mixture is allowed to react to obtain an acrylic-urethane resin (B 1), which is an object product. In the above-mentioned reaction, there can be, of course, used an appropriate catalyst. Moreover, the above-mentioned number of moles to be reacted of each of the ingredients is shown in the case of m=2 in formula (3); and in the case of m=3, the numbers of moles to be reacted of the respective ingredients can be changed to 8 moles, 4 moles, 3 moles and 2 moles. For the other cases, the corresponding changes may be applied to produce the resin; however, the present invention is not intended to be limited thereby.

With respect to the acrylic-urethane resin (B), an acrylic-urethane resin (B2) represented by the following formula (5) is adopted:

a temperature in the range of 50 to 80° C., 2 moles of a compound having not less than one ethylenically unsaturated groups as well as one hydroxyl group (2-hydroxyethyl acrylate (2HEA), 2-hydroxyethyl methacrylate, 2-hydroxypropyl (meth)acrylate, etc.) is added, and allowed to react to obtain an acrylic-urethane resin (B2), which is an object product. In the above-mentioned reaction, there can be, of course, used an appropriate catalyst. Moreover, the above-mentioned number of moles to be reacted of each of the ingredients is shown in the case of l=2 in formula (5); and in the case of l=3, the numbers of moles to be reacted of the respective ingredients can be changed to 4 moles, 3 moles, and 2 moles. For the other cases, the corresponding changes may be applied to produce the resin; however, the present invention is not intended to be limited thereby.

With respect to the acrylic-urethane resin (B), an acrylic-urethane resin (B3) represented by the following formula (6) is adopted. The acrylic-urethane resin (B3) is preferably provided as an acrylic-urethane resin which has an acid number in the range of 10 to 100 mgKOH/g, and contains a carboxyl group.

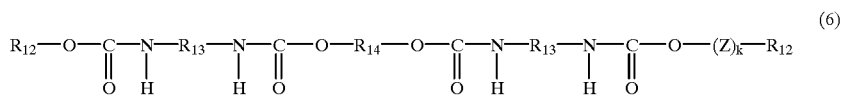

(6)

(wherein Z represents a structure represented by the following formula (7), $R_{12}$ represents a urethane-bond remaining

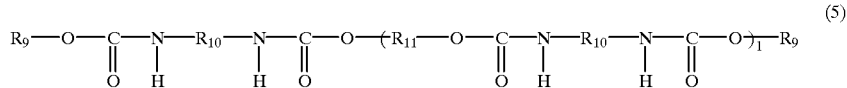

(5)

(wherein $R_9$ represents a urethane-bond remaining group of a compound having not less than one ethylenically unsaturated groups and one hydroxyl group, $R_{10}$ represents both ends of urethane-bond remaining groups of diisocyanate compound, $R_{11}$ represents polyol or polyester polyol having the average molecular weight of 500 to 10000, and l represents a positive integer of not more than 20.)

There is no particular limitation for the preparation method of the above-mentioned acrylic-urethane resin (B2), but for example, , when l=2 in formula (5), 3 moles of isocyanate (2,4- or 2,6-tolylene diisocyanate, m- or p-xylylene diisocyanate, hydrogenated xylylene diisocyanate, diphenylmethane-4,4'-diisocyanate or its modified compound or polymer, hexamethylene diisocyanate, isophorone diisocyanate, 1,4-tetramethylene diisocyanate, naphthalene diisocyanate, etc.) and 2 moles of polyol having the average molecule weight of 500 to 10000 (polyether polyol, polyester polyol, polycarbonate polyol, acryl polyol, polybutadiene polyol, polyolefin polyol, etc., more preferably, those having the average molecule weight of 500 to 4000) are mixed, and the reaction is continued. At group of a compound having not less than three ethylenically unsaturated groups and one hydroxyl group, $R_{13}$ represents both ends of urethane-bond remaining groups of diisocyanate compound, $R_{14}$ represents both ends of urethane remaining groups of 2,2-bis(hydroxymethyl) propionic acid or 2,2-bis(hydroxymethyl) butanoic acid, and k represents a positive integer of not more than 20.)

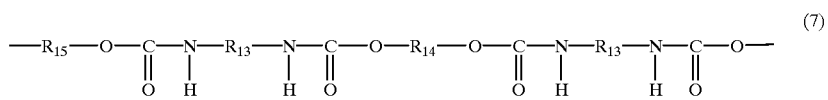

(7)

(wherein $R_{15}$ represents polyol or polyester polyol having the average molecular weight of 500 to 10000, and $R_{13}$ and $R_{14}$ respectively represent the same remaining groups as defined above.)

There is no particular limitation for the preparation method of obtaining the above-mentioned acrylic-urethane resin containing a carboxyl group (B3), but for example, when k =2 in formula (6), 6 moles of isocyanate (2,4- or 2,6-tolylene diisocyanate, m- or p-xylylene diisocyanate, hydrogenated xylylene diisocyanate, diphenylmethane-4,4'-diisocyanate or its modified compound or polymer, hexamethylene diisocyanate, isophorone diisocyanate, 1,4- tetramethylene diisocyanate, naphthalene diisocyanate, etc.) and 3 moles of 2,2-bis(hydroxymethyl)propionic acid (BMPA) or 2,2-bis(hydroxymethyl)butanoic acid (BMBA) are allowed to react in a solvent (ethyl acetate, ethyl acetate/toluene mixture, ethyl acetate/2-butanone mixture, etc.) approximately at a temperature in the range of 50 to 95° C. under an inert gas atmosphere of nitrogen gas, etc. Next, to this is added 2 moles of polyol having the average molecule weight of 500 to 10000 (polyether polyol, polyester polyol, polycarbonate polyol, acryl polyol, polybutadiene polyol, polyolefin polyol, etc., more preferably, those having the average molecule weight of 500 to 4000), and the reaction is further continued. At a temperature in the range of 50 to 80° C., 2 moles of a compound having not less than three ethylenically unsaturated groups as well as one hydroxyl group (pentaerythritol triacrylate, pentaerythritol trimethacrylate, etc.) is added, and allowed to react to obtain an acrylic-urethane resin (B3), which is an objective product. In the above-mentioned reaction, there can be used, of course, an appropriate catalyst. Moreover, the above-mentioned number of moles to be reacted of each of the ingredients is shown in the case of k=2 in formula (1); and in the case of k=3, the numbers of moles to be reacted of the respective ingredients can be changed to 8 moles, 4 moles, 3 moles and 2 moles. For the other cases, the corresponding changes may be applied to produce the resin, however, the present invention is not intended to be limited thereby.

Thus, there can be obtained the acrylic-urethane resin (A) containing a carboxyl group and the acrylic-urethane resin (B). The blending ratio (A:B) by weight of the materials (A) and (B) in the photosensitive resin composition of the present invention is preferably in the range of 100:0 to 50:50. The blending ratio by weight less than 50:50 is not preferable since it causes degradation in the developing and reduction in the resolution. The ratio is more preferably in the range of 95:5 to 60:40.

There is no particular limitation for the photo-polymerization initiator (C) used in the present invention, and the well-known photo-polymerization initiators can be used. Examples are, p,p'-bis(dimethylamino)benzophenone, p,p'-bis(diethylamino)benzophenone, p,p'-bis(dibutylamino)benzophenone, benzoin, benzoin methyl ether, benzoin ethyl ether, benzoin isopropyl ether, benzoin n-butyl ether, benzoin phenyl ether, benzoin isobutyl ether, benzoylbenzoic acid, methyl benzoylbenzoate, benzyl diphenyl sulfide, benzyl dimethyl ketal, dibenzyl, diacetyl, anthraquinone, naphthoquinone, 3,3'-dimethyl-4-methoxybenzophenone, benzophenone, dichloroacetophenone, 2-chlorothioxanthone, 2-methylthioxanthone, 2,4-diethylthioxanthone, 2,2-diethoxyacetophenone, 2,2-dichloro-4-phenoxyacetophenone, phenylglyoxylate, α-hydroxyisobutylphenone, dibenzosparone, 1-(4-isopropylphenyl)-2-hydroxy-2-methyl-1-propanone, 2-methyl-[4-(methylthio)phenyl]-2-morpholino-1-propanone, tribromophenylsulfone, and tribromomethylphenylsulfone, and moreover, triazine derivatives, such as 2,4,6-[tris(trichloromethyl)]-1,3,5-triazine, 2,4-[bis(trichloromethyl)]-6-(4'-methoxyphenyl)-1,3,5-triazine, 2,4-[bis(trichloromethyl)]-6-(4'-methoxynaphthyl)-1,3,5-triazine, 2,4-[bis(trichloromethyl)]-6-(piperonyl)-1,3,5-triazine, 2,4-[bis(trichloromethyl)]-6-(4'-methoxystyryl)-1,3,5-triazine, acryzine derivatives such as acryzine and 9-phenylacryzine, etc., 2,2'-bis(o-chlorophenyl)-4,5,4',5'-tetraphenyl-1,2'-biimidazole, 2,2'-bis(o-chlorophenyl)-4,5,4',5'-tetraphenyl-1,1'-biimidazole, 2,2'-bis(o-fluorophenyl)-4,5,4',5'-tetraphenyl-1,1'-biimidazole, 2,2'-bis(o-methoxyphenyl)-4,5,4',5'-tetraphenyl-1,1'-biimidazole, 2,2'-bis(p-methoxyphenyl)-4,5,4',5'-tetraphenyl-1,1'-biimidazole, 2,4,2',4'-bis[bi(p-methoxyphenyl)]-5,5'-diphenyl-1,1'-biimidazole, 2,2'-bis(2,4-dimethoxyphenyl)-4,5,4',5'-diphenyl-1,1'-biimidazole, 2,2'-bis(p-methylthiophenyl)-4,5,4',5'-diphenyl-1,1'-biimidazole, bis(2,4,5-triphenyl)-1,1'-biimidazole, etc., are used. Moreover, hexaaryl biimidazole derivatives disclosed in Japanese Examined Patent Publication No. 37377/1970 (Tokukoushou 45-37377) which are tautomers having covalent bonds at 1,2'-, 1,4'-, and 2,4'-, etc., triphenylphosphine, as well as 2-benzoyl-2-dimethyamino-1-[4-morpholinophenyl]-butane, are listed. Among those, hexaaryl biimidazole derivatives are preferably used.

The content of the photo-polymerization initiator (C) is preferably 0.1 to 20 parts by weight based on 100 parts by weight of the above-mentioned (A) and (B). The content less than 0.1 parts by weight causes extreme degradation in the sensitivity, failing to provide an effective operability. On the other hand, the content beyond 20 parts by weight causes degradation in the retaining stability upon formation of DFRs, which is not preferable. The content is preferably in the range of 1 to 7 parts by weight.

Moreover, in the present invention, it is preferable to contain a leuco dye (D). As the leuco dye (D), examples are: bis(4-N,N-diethylamino-o-tolyl)methylenethiophenylmethane, bis(4-N,N-diethylamino-o-tolyl)benzylthiophenylmethane, a leuco crystal violet, a leuco malachite green, a leuco diamond green, etc. Among those, one or more kinds of the leuco crystal violet, the leuco malachite green and the leuco diamond green are preferably used. The content of the leuco die (D) is preferably in the range of 0.05 to 3 parts by weight based on 100 parts by weight of the acrylic-urethane resin (A) containing a carboxyl group and the acrylic-urethane resin (B). The content less than 0.05 part by weight causes extreme degradation in the sensitivity, failing to provide an effective operability. On the other hand, the content beyond 3 parts by weight causes degradation in the stability upon formation of DFRs, which is not preferable. The content is more preferably set in the range of 0.1 to 1 part by weight.

Thus, the photosensitive resin composition of the present invention is obtained, and in the present invention, the following ethylenically unsaturated compounds can be blended besides the above-mentioned (A) through (D): monomers having one functional group, such as 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, 3-chloro-2-hydroxypropyl (meth)acrylate, glycerin mono(meth)acrylate, 2-(meth)acryloyloxyethylacidphosphate, half (meth)acrylate of a phthalic acid derivative and N-methylol (meth)acrylamide; monomers having two functional groups, such as ethyleneglycole di(meth)acrylate, diethyleneglycole di(meth)acrylate, tetraethyleneglycole di(meth)acrylate, polyethyleneglycole di(meth)acrylate, propyleneglycole di(meth)acrylate, polypropyleneglycole di(meth)acrylate, butyleneglycole di(meth)acrylate, neopentylglycole di(meth)acrylate, bisphenol A-type di(meth)acrylate modified with ethyleneoxide, bisphenol A-type di(meth)acrylate modified with propyleneoxide, 1,6-hexanediol di(meth)acrylate, glycerine di(meth)acrylate, pentaerythritol di(meth)acrylate, ethyleneglycoldiglycidylether di(meth)acrylate, diethyleneglycoldiglycidylether di(meth)acrylate, phthalic diglycidylester di(meth)acrylate, neopentylglycol di(meth)acrylate modified with hydroxypivaline acid; monomers having tri- or more functional groups, such as trimethylolpropane tri(meth)acrylate, pentaerythritol tri(meth)acrylate, glycerine tri(meth)acrylate, penetaerythritol tetra(meth)acrylate, dipentaerythritol penta(meth)acrylate, tri(meth)acryloyloxyethoxytrimethylolpropane, glycerinpolydiglycidylether poly(meth)acrylate. The blending amount of the ethylenically unsaturated compound is preferably in the range of 0 to 20 parts by weight based on 100 parts by weight of the acrylic-urethane resin (A) containing a carboxyl group and the acrylic-urethane resin (B), and more preferably in the range of 0 to 10 parts by weight. The blending amount beyond 20 parts by weight causes the photo-setting resist to become too hard, resulting in degradation in the sandblasting resistance.

Furthermore, there can be added, if necessary, additive agents, for example, coloring dyes, such as a crystal violet, a malachite green, a brilliant green, a patent blue, a methyl violet, a victoria blue, a rose aniline, parafuchsine, and an ethylene violet, contact-property-adding agents, plasticizers, antioxidants, thermal polymerization inhibitor, solvents, surface-tension modifiers, stabilizers, chain-transfering agents, antifoaming agents, flame retardants, etc.

Next, referring to FIGS. 1(a)–1(h), an explanation will be given of the production of a DFR using the photosensitive resin composition of the present invention, and the formation of a plasma display barrier rib by means of a sandblast method using such a DFR.

(Formation Method of Layer)

After applying the above-mentioned photosensitive resin composition onto a base film such as a polyester film, polypropylene film, and polystyrene film, the coated surface is covered with a protective film such as a polyethylene film and a polyvinylalcohol film to obtain a DFR.

As another application except for DFRs, the photosensitive resin composition of the present invention is directly applied to a subject material by means of conventional methods, such as a dip coating method, a flow coating method and a screen printing method, so that a photosensitive layer with a thickness of 1 to 150 lm can be readily formed. Upon coating, there can be added solvents, such as methyl ethyl ketone, methyl cellosolve acetate, ethyl cellosolve acetate, cyclohexane, methyl cellosolve, methylene chloride and 1,1,1 -trichloroethane.

(Exposure)

In the case when an image formation is carried out by the DFR, the adhesion between the base film and the photosensitive resin composition layer is compared with that between the protective film and the photosensitive resin composition layer, the film having the less adhesion is removed, and then, the side bearing the photosensitive resin composition layer 1 is affixed onto a rib layer 2 equally formed on glass 3 (see FIG. 1(a)) (a layer on which rib paste made of glass powder, a binder and a solvent having a high boiling point is printed and (see FIG. 1(a)) or an SiC substrate (see FIG. 1(b)). Thereafter, a pattern mask 4 is made in contact with the other film 9 and exposure is carried out (see FIG. 1(c)). When the photosensitive resin composition does not have an enough adhesion, the pattern mask can be directly made in contact with the photosensitive resin composition layer after the other film 9 has been removed, and then exposure is carried out.

In the case of direct coating on the surface of the rib layer, a pattern mask is made in contact with the coated surface directly, or via a polyester film, etc., and exposure is carried out.

Exposure 5 is usually carried out by using ultraviolet light irradiation, and as a light source there can be used a high-pressure mercury lamp, an ultra-high-pressure mercury lamp, a carbon arc lamp, a xenon lamp, a metal halide lamp, a chemical lamp, etc. After irradiation by the ultraviolet light, heat treatment may be applied, if necessary, on demand so as to ensure.

(Development)

After exposure, the film 9 (a base film or a protective film) on the resist is separated and removed, and then a developing process is carried out (see FIG. 1(d)).

As the photosensitive resin composition the present invention is of the dilute-alkali developing type, the developing process after exposure is carried out by using 0.01 to 2% by weight of a dilute alkali aqueous solution such as sodium carbonate and potassium carbonate.

(Sandblast)

After formation of a pattern 6 of the photo-set resist as described above, powder 7, such as $CaCO_3$, $BaSO_4$, SiC, $SiO_2$, and $Al_2O_3$, having a particle diameter in the range of 0.1 to 100 μm, is air-blasted at a blast pressure in the range of 0.5 to 10 kg to carry out the sandblast process of the rib layer 2 exposed by the development (see FIGS. 1(e) and 1(f)).

Alternately, powder 7, such as SiC, $SiO_2$, and $Al_2O_3$, having a particle diameter in the range of 0.1 to 100 μm, is air-blasted at a blast pressure in the range of 0.5 to 10 kg to carry out the sandblast process, the surface of the SiC substrate exposed by the development.

(Separation of Photo-set Resist)

After the sandblast process, the pattern 6 of the remaining set resist is separated (see FIG. 1(g)).

The separation and removal of the pattern 6 of the set resist is carried out by using an alkali separation liquid with a concentration in the range of 1 to 5% by weight comprising an alkali aqueous solution, such as sodium hydroxide and potassium hydroxide. Instead of separation using the alkali aqueous solution, the pattern of the set resist can be burnt and eliminated. After separation of the photo-set resist, the remaining rib layer 2 is baked so as to form a barrier rib 8 (see FIG. 1(h)).

The above-mentioned explanation has been given of the formation of the plasma display barrier rib; however, the present invention is effectively applied to sandblast methods of dicing for silicon wafers, PZT (piezoelectric element) processing, glass engraving, ceramics processing, etc. It is also applied to production of metal masks for glass products, engraving for tombstones, etc.

The present invention is then explained concretely based on Examples, but is not limited thereto. Additionally, "0%" and "part" in the embodiments are based on weight unless otherwise defined.

[Synthesis of Acrylic-urethane Resin (A) Containing a Carboxyl Group]

Acrylic-urethane Resin (A1) Containing a Carboxyl Group

A four-necked flask equipped with a thermometer, a mixer, a water-cooling condenser and a nitrogen feeding port was charged with 44.4 g (0.2 mole) of isophorone diisocyanate (IPDI), 13.4 g (0.1 mole) of 2,2-bis(hydroxymethyl) propionic acid (BMPA) and 74.0 g of ethyl acetate, and this was allowed to react in a nitrogen atmosphere at 75° C. At the time of 7% of the NCO value, to this was added 67 g (0.070 mole) of a condensed polymer (hydroxide number: 117mgKOH/g)having the average molecular weight of 1000 containing diethylene glycol/adipic acid at a mole ratio of 1.12/1 and 0.02 g of dibutyl tin laurate, and the reaction was further continued. At the time of the NCO value of 1.4%, the temperature was lowered to 60° C., and 7.7 g (0.067 mole) of 2-hydroxyethyl acrylate (2HEA) was added and allowed to react. The reaction was completed at the time of 0.35% of the NCO value to obtain a paste of an acrylic-urethane resin (A1) containing a carboxyl group.

The acrylic-urethane resin (A1) containing a carboxyl group in the obtained paste has a structure in which, in formulas (1) and (2), $R_1$ is represented by the following formula (8), $R_2$ is represented by the following formula (9), $R_3$ is represented by the following formula (10), $R_4$ is polyester polyol (hydroxide number: 117 mgKOH/g) having a molecular weight of 1000 with n=2 structure, the acrylic-urethane resin (A1) containing a carboxyl group constitutes 64.2% in the paste, the NCO value of the acrylic-urethane resin (A1) containing carboxyl group is 0.35% and the acid number thereof is 41.9 mgKOH/g (the acid number of the paste: 27.1 mgKOH/g).

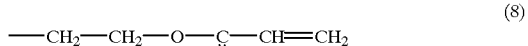  (8)

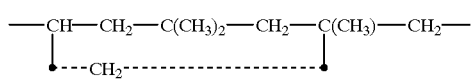  (9)

  (10)

Acrylic-urethane resin (A2) containing a carboxyl group

In the above-mentioned (A1) preparation method, except that 14.8 g (0.1 mole) of 2,2-bis(hydroxymethyl)butanoic acid (BMBA) was used instead of 13.4 g of 2,2-bis(hydroxymethyl)propionic acid (BMPA), the same processes were carried out. A paste of an acrylic-urethane resin (A2) having a carboxyl group was obtained in which, in formulas (1) and (2), $R_1$ is represented by the above-mentioned formula (8), $R_2$ is represented by the above-mentioned formula (9), R3 is represented by the following formula (11), $R_4$ is polyester polyol (hydroxide number: 117 mgKOH/g) having a molecular weight of 1000 with n=2 structure, the acrylic-urathane resin (A2) containing a carboxyl group constitutes 64.4% in the paste, the NCO value thereof is 0.35% and the acid number thereof is 41.7 mgKOH/g (the acid number thereof of the past: 26.9 mgKOH/g).

—CH$_2$—C(CH$_3$)(CH$_2$COOH)—CH$_2$—  (11)

Acrylic-urethane Resin (A3) Containing a Carboxyl Group

In the above-mentioned (A2) preparation method, except that 65.0 g of ethyl acetate, 80 g (0.052 mole) of the condensed polymer (hydroxide number: 73 mgKOH/g) having the average molecular weight of 1500, and 11.6 g (0.1 mole) of 2-hydroxyethyl acrylate (2HEA) was used, the same processes were carried out. A paste of an acrylic-urethane resin (A3) having a carboxyl group was obtained in which, in formulas (1) and (2), R, is represented by the above-mentioned formula (8), $R_2$ is represented by the above-mentioned formula (9), $R_3$ is represented by the above-mentioned formula (11), $R_4$ is polyester polyol (hydroxide number: 73 mgKOH/g) having a molecular weight of 1500 with n=1 structure, the acrylic-urethane resin (A3) containing a carboxyl group constitutes 70.0% in the paste, the NCO value thereof is 0.30% and the acid number thereof: 37.1 mgKOH/g (the acid number of the paste: 26.0 mgKOH/g).

[Synthesis of Acrylic-urethane Resin (B)]

Acrylic-urethane Resin (B1-1)

A four-necked flask equipped with a thermometer, a mixer, a water-cooling condenser and a nitrogen feeding port was charged with 44.4 g (0.2 mole) of isophorone diisocynate (IPDI), 10.4 g (0.1 mole) of neopentyl glycol (NPG) and 63.8 g of ethyl acetate, and this was allowed to react in a nitrogen atmosphere at 75° C. At the time of 7% of the NCO value, to this was added 67 g (0.070 mole) of condensed polymer (hydroxide number: 117 mgKOH/g) having the average molecular weight of 1000 containing diethylene glycol/adipic acid at a mole ratio of 1.12/1 and 0.02 g of dibutyl tin laurate, and the reaction was further continued. At the time of the NCO value of 1.4%, the temperature was lowered to 60° C., and 7.7 g (0.067 mole) of 2-hydroxyethyl acrylate (2HEA) was added and allowed to react. The reaction was completed at the time of 0.35% of the NCO value to obtain a solution of an acrylic-urethane resin (B1-1).

The obtained acrylic-urethane resin (B1-1) in the solution has a structure in which, in formulas (3) and (4), $R_5$ is represented by the above-mentioned formula (8), $R_6$ is represented by the above-mentioned formula (9), $R_7$ is represented by the following formula (12), $R_8$ is polyester polyol (hydroxide number: 117 mgKOH/g) having a molecular weight of 1000 with m=2 structure, the acrylic-urethane resin (B1-1) constitutes 67.0% in the solution, the NCO value of the acrylic-urethane resin (B1-1) containing carboxyl group is 0.35% and the acid number thereof is 0 mgKOH/g.

—CH$_2$—C(CH$_3$)$_2$—CH$_2$—  (12)

Acrylic-urethane Resin (B1-2)

In the above-mentioned (B1-1), except that 10.6 g (0.1 mole) of diethylene glycol was used instead of 10.4 g of neopentyl glycol (NPG), the same processes were carried out. A solution thus obtained contains an acrylic-urethane resin (B1-2) having a structure in which, in formulas (3) and (4), $R_5$ is represented by the above-mentioned formula (8), $R_6$ is represented by the above-mentioned formula (9), $R_7$ is represented by the following formula (13), $R_8$ is polyester polyol (hydroxide number: 117mgKOH/g) having a molecular weight of 1000 with m =2 structure, the acrylic-urethane resin (B1-2) constitutes 67.0% in the solution, the NCO value thereof is 0.35% and the acid number thereof is 0 mgKOH/g.

—CH$_2$CH$_2$—O—CH$_2$CH$_2$—  (13)

Acrylic-urethane Resin (B1-3)

In the above-mentioned (B1-1) preparation method, except that 11.8 g (0.1 mole) of 1,6-hexanediol was used instead of 10.4 g of neopentyl glycol (NPG), the same processes were carried out. A solution thus obtained contains an acrylic-urethane resin (B1-3) having a structure in which, in formulas (3) and (4), $R_5$ is represented by the above-mentioned formula (8), $R_6$ is represented by the above-mentioned formula (9), $R_7$ is represented by the following formula (14), $R_8$ is polyester polyol (hydroxide numer: 117 mgKOH/g) having a molecular weight of 1000 with m=2 structure, the acrylic-urethane resin (B 1-3) constitutes 67.0% in the solution, the NCO value is 0.35% and the acid number thereof is 0 mgKOH/g.

—(C H$_2$)$_6$—  (14)

Acrylic-urethane Resin (B2-1)

A four-necked flask equipped with a thermometer, a mixer, a water-cooling condenser and a nitrogen feeding port was charged with 88.8 g (0.4 mole) of isophorone diisocynate (IPDI) and 200 g (0.209 mole) of the condensed polymer (hydroxide number: 117 mgKOH/g) having the average molecular weight of 1000 containing diethylene glycol/adipic acid at a mole ratio of 1.12/1, and this was allowed to react in a nitrogen atmosphere at 75° C. At the time of 6% of the NCO value, the temperature was lowered to 60° C., and 46.5 g (0.4 mole) of 2-hydroxyethyl acrylate (2HEA) was added and allowed to react. The reaction was completed at the time of 0.35% of the NCO value to obtain a solution of an acrylic-urethane resin (B2-1).

The obtained acrylic-urethane resin (B2-1) in the solution has a structure in which, in formulas (5), $R_9$ is represented by the above-mentioned formula (8), $R_{10}$ is represented by the above-mentioned formula (9), $R_{11}$ is polyester (hydroxide number: 59 mgKOH/g) having a molecular weight of 1000 with m=1 structure, the acrylic-urethane resin (B2-1) constitutes 100% in the solution, the NCO value of the acrylic-urethane resin (B2-1) is 0.35% and the acid number thereof is 0 mgKOH/g.

Acrylic-urethane Resin (B2-2)

In the above-mentioned (B2-1), except that the average molecular weight of the condensed polymer (hydroxide number: 59 mgKOH/g) was adjusted to 2000 and 515 g (0.27 mole) of the condensed polymer (hydroxide number: 59 mgKOH/g) was used, and that 30.2 g (0.26 mole) of 2-hydroxyethyl acrylate (2HEA) was used, the same processes were carried out. A solution thus obtained contains an acrylic-urethane resin (B2-2) having a structure in which, in formulas (5), $R_9$ is represented by the above-mentioned formula (8), $R_{10}$ is represented by the above-mentioned formula (9), $R_{11}$ is polyester (hydroxide number: 59 mgKOH/g) having a molecular weight of 2000 with I=2 structure, the acrylic-urethane resin (B2-2) constitutes 100% in the solution, the NCO thereof is 0.35% and the acid number thereof is 0 mgKOH/g.

Acrylic-urethane Resin (B2-3)

In the above-mentioned (B2-1), except that the average molecular weight of the condensed polymer(hydroxide number: 73 mgKOH/g) was adjusted to 1500 and 300 g (0.2 mole) of the condensed polymer was used, the same processes were carried out. A solution thus obtained contains an acrylic-urethane resin (B2-3) having a structure in which, in formulas (5), Rg is represented by the above-mentioned formula (8), Rlo is represented by the above-mentioned formula (9), $R_{11}$ is polyester (hydrooxide number: 73 mgKOH/g) having a molecular weight of 1500 with l=1 structure, the acrylic-urethane resin (B2-3) constitutes 100%, the NCO value thereof is 0.35% and the acid number thereof is 0 mgKOH/g.

Acrylic-urethane Resin (B3-1) Containing a Carboxyl Group

A four-necked flask equipped with a thermometer, a mixer, a water-cooling condenser and a nitrogen feeding port was charged with 44.4 g (0.2 mole) of isophorone diisocynate (IPDI), 13.4 g (0.1 mole) of 2,2-bis(hydroxymethyl) propionic acid (BMPA) and 62.1 g of ethyl acetate, and this was allowed to react in a nitrogen atmosphere at 75° C. At the time of 7% of the NCO value, to this was added 67 g (0.070 mole) of condensed polymer (hydroxide number: 117mgKOH/g) having the average molecular weight of 1000 containing diethylene glycol/adipic acid at a mole ratio of 1.12/1 and 0.02 g of dibutyl tin laurate, and the reaction was further continued. At the time of the NCO value of 1.4%, the temperature was lowered to 60° C., and 30.5 g (0.067 mole) of pentaerythritol triacrylate (PETA) (hydroxide number: 123 mgKOH/g) was added and allowed to react. The reaction was completed at the time of 0.35% of the NCO value to obtain a solution of an acrylic-urethane resin (B3-1).

The acrylic-urethane resin (B3-1) in the solution has a structure in which, in formulas (6) and (7), $R_{12}$ is represented by the following formula (15), $R_{13}$ is represented by the above-mentioned formula (9), $R_{14}$ is represented by the above-mentioned formula (10), $R_{15}$ is polyester polyol (hydroxide number: 117 mgKOH/g) having a molecular weight of 1000 with k=2 structure, the acrylic-urethane resin (B3-1) constitutes 71.4% in the solution, the NCO value of the acrylic-urethane resin (B3-1) containing carboxyl group is 0.35% and the acid number thereof is 36.0 mgKOH/g (the acid number of the paste: 25.7 mgKOH/g).

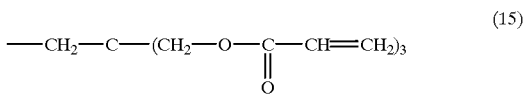

(15)

Acrylic-urethane Resin (B3-2) Containing a Carboxyl Group

In the above-mentioned (B3-1), except that,, 14.8 g (0.1 mole) of 2,2-bis(hydroxymethyl)butanic acid (BMBA) was used instead of 13.4 g of 2,2-bis(hydroxymethyl)propionic acid (BMPA), the same processes were carried out. A solution of an acrylic-urethane resin (B3-2) was obtained, in which, in formulas (6) and (7), $R_{12}$ through $R_{14}$ are the same as described above, $R1_{15}$ is polyester polyol (hydroxide number: 117 mgKOH/g) having a molecular weight of 1000 with k=2 structure, the acrylic-urethane resin (B3-2) containing a carboxyl group constitutes 70.2%, the NCO value thereof is 0.35% and the acid number thereof is 35.8 mgKOH/g (the acid number of the paste: 25.6 mgKOH/g).

EMBODIMENT 1

The following processes were carried out by using the above-mentioned paste of the acrylic-urethane resin (A1) containing a carboxyl group and the solution of the acrylic-urethane resin (B1-1).

(Preparation of Dope)

155.8 parts of the paste of the acrylic-urethane resin (A1) containing a carboxyl group (100 parts of the acrylic-urethane resin (A1)), 52.2 parts of the solution of the acrylic-urethane resin (B1-1) (35 parts of the acrylic-urethane resin (B1-1)), 5.0 parts of 2,2'-bis(o-chlorophenyl)-4,5,4',5'-tetraphenyl-1,2'-biimidazole(C), 1.0 part of a leuco crystal violet (D), 0.1 part of P,P'-bis(diethylamino) benzophenone, 0.1 part of a malachite green and 42.5 parts of methyl ethyl ketone were blended and sufficiently mixed to prepare a dope.

(Formation of DFR)

Next, the dope was applied onto a polyester film with a thickness of 20 tm by using an applicator with a gap of 6 mill, and this was allowed to stand for 1 minute 30 seconds at room temperature, and then dried in ovens set at 60° C., 90° C. and 1 10° C. for three minutes respectively to prepare a DFR with a resist thickness of 40 μm (in this case, no protective film was placed).

(Lamination Onto a Glass Substrate for Rib Formation)

This DFR was stacked on a glass substrate for rib formation (a glass substrate coated with a rib-forming composition "White Rib DLS-3551" with a thickness of 200 μm, available from Nippon Electric Glass Co., Ltd.) that was preheated to 60° C. by oven, under conditions of a laminating-role temperature of 100° C., a role pressure of 3 kg/cm² and a laminating speed of 2 m/sec.

(Exposure)

After laminating, this was allowed to stand at room temperature for 10 minutes so as to be cooled off, and was subjected to exposure by using a parallel exposing machine "EXM-1201" made by Ork Manufacturing Co., Ltd.
[Sensitivity]

In the above-mentioned exposure, by using a stphar step tablet with 21 steps was applied, and exposing processes were carried out for every 50 mj/cm² from 50 mj/cm² to 1000 mj/cm², and a developing process was carried out for 35 seconds by using 0.3% $Na_2CO_3$ aqueous solution (30° C.) at a spray pressure of 1.5 kg/cm² to find the dose of exposure at the time when the 7th step tablet remained so as to determine the sensitivity.

[Resolution]

In L(line width)/S(space width), pattern masks from 10 to 100 μm of S with L=400 μm placed in every 5 μm were allowed to vacuum-contact each other, and an exposing process was carried out by using the dose of exposure at the 7th step tablet, and then a developing process was carried out for 35 seconds by using 0.3% $Na_2CO_3$ aqueous solution (30° C.) at a spray pressure of 1.5 kg/cm² to evaluate through observation under a microscope.

○—Lines (S) thinner than 60 μm are developed.

×—It is impossible to develop Lines (S) of 60 μm.

[Chemical Resistance for Developer]

In L(line width)/S(space width), pattern masks from 10 to 150 μm of L with S=400 μm placed in every 10 μm were allowed to vacuum-contact each other, and an exposing process was carried out by using the dose of exposure at the 7th step tablet, and then a developing process was carried out for 35 seconds by using 0.3% $Na_2CO_3$ aqueous solution (30° C.), at a spray pressure of 1.5 kg/cm² to evaluate through observation under a microscope.

○—No damage is observed in 50 μm of L.

×—Damage is observed in 50 μm of L.

[Sandblasting Resistance]

By using the dose of exposure at the 7th step tablet, pattern masks with L(line width)/S(space width) of 50/150 were allowed to vacuum-contact each other and an exposing process was carried out, and then a developing process was carried out for 35 seconds by using 0.3% $Na_2CO_3$ aqueous solution (30° C.) at a spray pressure of 1.5 kg/cm². Thereafter, a sandblasting process was carried out while the surface thereof was being observed under a microscope by using "PNEUMA BLASTER" made by Fuji manufacturing Co., Ltd., so that the width of the opening at the edge portion became an average value of 140 μm. The state of the resist after blast was visually observed under a microscope to evaluate as follows:

○—No damage was observed in the resist pattern.

×—The resist was partially separated, and the exposed rib surface was subjected to blast.

[Retaining Stability]

Moreover, the DFR was sandwiched by a PET film and a PE film so as to form a structure with three layers as PET film/resist layer/PE film, and was left in a thermohygrostat that was set at 35° C. and 40 RH % while being shielded from light by black poly for two days. Then, the film was stacked on a rib-forming glass substrate under the same conditions as a film without having been left was stacked, and then exposed and developed under the same conditions. Thus, evaluation was made by checking to see a developable (resolvable) minimum line width that varies depending on the stand-still history.

○—The difference between developable minimum line widths related to the stand-still history is within 20 μm.

×—The difference between developable minimum line widths related to the stand-still history is beyond 20 μtm.

EMBODIMENT 2

In Embodiment 1, except that 155.3 parts by weight of the paste of acrylic-urethane resin (A2) containing a carboxyl group was used instead of the paste of the acrylic-urethane resin (A1) containing a carboxyl group, and that 25.0 parts of the solution of the acrylic-urethane resin (B1-1) ((B1-1) 16.8 parts) was used, the same processes were carried out as Embodiment 11. Thus, a DFR was prepared, and stacked onto a rib-forming glass substrate and evaluated in the same manner.

EMBODIMENT 3

In Embodiment 2, except that the solution of the acrylic-urethane resin (B1-2) was used instead of the solution of the acrylic-urethane resin (B1-1), the same processes were carried out as Embodiment 1. Thus, a DFR was prepared, and then stacked onto a rib-forming glass substrate and evaluated in the same manner.

EMBODIMENT 4

In Embodiment 2, except that 144.9 parts by weight of the paste of acrylic-urethane resin (A3) containing a carboxyl group was used instead of the paste of the acrylic-urethane resin (A1) containing a carboxyl group, and that the solution of the acrylic-urethane resin (B 1-3) was used instead of the solution of the acrylic-urethane resin (B1-1), the same processes were carried out as Embodiment 1. Thus, a DFR was prepared, and then stacked onto a rib-forming glass substrate and evaluated in the same manner.

EMBODIMENT 5

In Embodiment 1, except that 77.9 parts by weight of the paste of the acrylic-urethane resin (Al) containing a carboxyl group and 77.6 parts of the paste of the acrylic-urethane resin (A2) were used as the acrylic-urethane resin containing a carboxyl group, and that, instead of 52.2 parts, 37.3 parts of the solution of the acrylic-urethane resin (B1-1) was used, the same processes were carried out as Embodiment 1. Thus, a DFR was prepared, and then stacked onto a rib-forming glass substrate and evaluated in the same manner.

EMBODIMENT 6

In Embodiment 1, except that the amount of (C) was changed from 5.0 parts to 3.0 parts without using (D), the same processes were carried out as Embodiment 1. Thus, a DFR was prepared, and then stacked onto a rib-forming glass substrate and evaluated in the same manner.

COMPARATIVE EXAMPLE 1

In Embodiment 1, except that the amount of the paste of the acrylic-urethane resin (Al) containing a carboxyl group was changed from 155.8 parts to 210.0 parts without using the solution of the acrylic-urethane resin (B1-1), the same processes were carried out as Embodiment 1. Thus, a DFR was prepared, and then stacked onto a rib-forming glass substrate and evaluated in the same manner.

COMPARATIVE EXAMPLE 2

In Embodiment 1, except that the amount of the solution of the acrylic-urethane resin (B 1-1) was changed from 52.2 parts to 201.0 parts without using the paste of the acrylic-urethane resin (Al) containing a carboxyl group, the same processes were carried out as Embodiment 1, Thus, a DFR was prepared, and then stacked onto a rib-forming glass substrate and evaluated in the same manner.

The results of evaluation of the embodiments and comparative embodiments are shown in Table 1.

TABLE 1

| | Sensitivity (mj/cm$^2$) | Resolution | Chemical resistance for developer | Sandblasting resistance | Stability |
|---|---|---|---|---|---|
| Ex. 1 | 200 | ○ | ○ | ○ | ○ |
| Ex. 2 | 250 | ○ | ○ | ○ | ○ |
| Ex. 3 | 300 | ○ | ○ | ○ | ○ |
| Ex. 4 | 250 | ○ | ○ | ○ | ○ |
| Ex. 5 | 250 | ○ | ○ | ○ | ○ |
| Ex. 6 | 900 | ○ | ○ | ○ | ○ |
| Comp. Ex. 1 | 350 | X | ○ | ○ | ○ |
| Comp. Ex. 2 | * | ** | ** | ** | ○ |

*The undeveloped film was left on the whole surface of substrate after exposure for 120 seconds owing to the poor developer property.
**Evaluation was impossible owing to the low sensitivity of substrate that was not developed enough.

EMBODIMENT 7

The following processes were carried out by using the above-mentioned paste of the acrylic-urethane resin (A1) containing a carboxyl group and the solution of the acrylic-urethane resin (B2-1).
(Preparation of Dope)
155.8 parts of the paste of the acrylic-urethane resin (A1) containing a carboxyl group (100 parts of the acrylic-urethane resin (A1)), 35 parts of the acrylic-urethane resin (B2-1), 5.0 parts of 2,2'-bis(o-chlorophenyl)-4,5,4',5'-tetraphenyl-1,2'-biimidazole(C), 1.0 part of a leuco crystal violet (D), 0.1 part of P,P'-bis(diethylamino)benzophenone, 0.1 part of a malachite green and 59.7 parts of methyl ethyl ketone were blended and sufficiently mixed to prepare a dope.
(Formation of DFR)
Next, the dope was applied onto a polyester film with a thickness of 20 μm by using an applicator with a gap of 6 mill, and this was allowed to stand for 1 minute 30 seconds at room temperature, and then dried in ovens set at 60° C., 90° C. and 1 10° C. for three minutes respectively to prepare a DFR with a resist thickness of 40 μm (in this case, no protective film was placed).
(Lamination Onto a Glass Substrate for Rib Formation)
This DFR was stacked on an SiC substrate that had been preheated to 60° C. by oven, under conditions of a laminating-role temperature of 100° C., a role pressure of 3 kg/cm$^2$ and a laminating speed of 2 m/sec.
(Exposure)
After laminating, this was allowed to stand at room temperature for 10 minutes so as to be cooled off, and was subjected to exposure by using a parallel exposing machine "EXM-1201" made by Ork Manufacturing Co., Ltd.
Sensitivity, resolution and retaining stability were evaluated in the same manner as described in Embodiment 1.
[Sandblasting Resistance]
By using the dose of exposure at the 7th step tablet, pattern masks, which was designed to provide an enormous number of 300 μmφ dots, were allowed to vacuum-contact each other and an exposing process was carried out, and then a developing process was carried out for 35 seconds by using 0.3% Na$_2$CO$_3$ aqueous solution (30° C.) at a spray pressure of 1.5 kg/cm$^2$. Thereafter, a sandblasting process was carried out with SiC#800 at a discharging pressure of 4 kg/cm$^2$ by using "PNEUMA BLASTER" made by Fuji manufacturing Co., Ltd. until the depth reached 200 μm. The state of the resist after blast was visually observed under a microscope to evaluate as follows:
  ○—No damage was observed in the resist pattern.
  x—The resist was partially separated, and the exposed SiC surface was subjected to blast.

EMBODIMENT 8

In Embodiment 7, except that the paste of acrylic-urethane resin (A2) containing a carboxyl group was used instead of the paste of the acrylic-urethane resin (A1) containing a carboxyl group, and that 16.8 parts of the acrylic-urethane resin (B2-1) was used, the same processes were carried out as Embodiment 1. Thus, a DFR was prepared, and stacked onto an SiC substrate and evaluated in the same manner.

EMBODIMENT 9

In Embodiment 8, except that the solution of the acrylic-urethane resin (B2-2) was used instead of the solution of the acrylic-urethane resin (B2-1), the same processes were carried out as Embodiment 1. Thus, a DFR was prepared, and then stacked onto an SiC substrate and evaluated in the same manner.

EMBODIMENT 10

In Embodiment 8, except that 144.9 parts of the paste of acrylic-urethane resin (A3) containing a carboxyl group was used instead of the paste of the acrylic-urethane resin (A2) containing a carboxyl group, and that the solution of the acrylic-urethane resin (B2-3) was used instead of the solution of the acrylic-urethane resin (B2-1), the same processes were carried out as Embodiment 1. Thus, a DFR was prepared, and then stacked onto an SiC substrate and evaluated in the same manner.

EMBODIMENT 11

In Embodiment 7, except that 77.9 parts of the paste of the acrylic-urethane resin (A1) containing a carboxyl group and 77.6 parts of the paste of the acrylic-urethane resin (A2) were used as the acrylic-urethane resin containing a carboxyl group, and that, instead of 35.0 parts, 25.0 parts of the solution of the acrylic-urethane resin (B2-1) was used, the same processes were carried out as Embodiment 1. Thus, a DFR was prepared, and then stacked onto an SiC substrate and evaluated in the same manner.

EMBODIMENT 12

In Embodiment 7, except that the amount of (C) was changed from 5.0 parts to 3.0 parts without using (D), the same processes were carried out as Embodiment 7. Thus, a DFR was prepared, and then stacked onto an SiC substrate and evaluated in the same manner.

COMPARATIVE EXAMPLE 3

In Embodiment 7, except that the paste of the acrylic-urethane resin (A1) containing a carboxyl group was changed from 155.8 parts to 210.0 parts without using solution of the acrylic-urethane resin (B2 -1), the same processes were carried out as Embodiment 7. Thus, a DFR was prepared, and then stacked onto an SiC substrate and evaluated in the same manner.

COMPARATIVE EXAMPLE 4

In Embodiment 7, except that the amount of the acrylic-urethane resin (B2-1) was changed from 35.0 parts to 134.7 parts without using the paste of the acrylic-urethane resin (A1) containing a carboxyl group, the same processes were carried out as Embodiment 7. Thus, a DFR was prepared, and then stacked onto an SiC substrate and evaluated in the same manner.

The results of evaluation of the embodiments and comparative embodiments are shown in Table 2.

TABLE 2

|  | Sensitivity (mj/cm$^2$) | Resolution | Sandblasting resistance | Stability |
|---|---|---|---|---|
| Ex. 7 | 200 | ○ | ○ | ○ |
| Ex. 8 | 250 | ○ | ○ | ○ |
| Ex. 9 | 300 | ○ | ○ | ○ |
| Ex. 10 | 250 | ○ | ○ | ○ |
| Ex. 11 | 250 | ○ | ○ | ○ |
| Ex. 12 | 900 | ○ | ○ | ○ |
| Comp. Ex. 3 | 350 | X | X | ○ |
| Comp. Ex. 4 | * | ** | ** | ○ |

*The undeveloped film was left on the whole surface of substrate after exposure for 120 seconds owing to the poor developer property.
**Evaluation was impossible owing to the low sensitivity of substrate that was not developed enough.

EMBODIMENT 13

The following processes were carried out by using the above-mentioned paste of the acrylic-urethane resin (A1) containing a carboxyl group and the solution of the acrylic-urethane resin (B3-1).
(Preparation of Dope)

There were blended and sufficiently mixed 155.8 parts of the paste of the acrylic-urethane resin (A1) containing a carboxyl group (100 parts of the acrylic-urethane resin (A7)), 49.0 parts of the solution of the acrylic-urethane resin (B3-1) (35 parts of the acrylic-urethane resin (B3-1)), 5.0 parts of 2,2'-bis(o-chlorophenyl)-4,5,4',5'-tetraphenyl-1,2'-biimidazole(C), 1.0 part of a leuco crystal violet (D), 0.1 part of P,P'-bis(diethylamino)benzophenone, 0.1 part of a malachite green and 42.5 parts of methyl ethyl ketone to prepare a dope.

The preparation of a DFR, lamitation onto a rib-forming glass substrate and exposure were carried out in the same manner as Embodiment 1.

Evaluation on the sensitivity, resolution, chemical resistance for developer, sandblasting resistance and retaining stability was made in the same methods as described in Embodiment 1.

EMBODIMENT 14

In Embodiment 13, except that 155.3 parts of the paste of acrylic-urethane resin (A2) containing a carboxyl group (100 parts of the resin) was used instead of the paste of the acrylic-urethane resin (A1) containing a carboxyl group, and that 23.5 parts of the solution of the acrylic-urethane resin (B3-1) ((B3-1) 16.8 parts) was used, the same processes were carried out as Embodiment 1. Thus, a DFR was prepared, and stacked onto a rib-forming glass substrate and evaluated in the same manner.

EMBODIMENT 15

In Embodiment 14, except that the solution of the acrylic-urethane resin (B3-2) was used instead of the solution of the acrylic-urethane resin (B3-1), the same processes were carried out as Embodiment 1. Thus, a DFR was prepared, and then stacked onto a rib-forming glass substrate and evaluated in the same manner.

EMBODIMENT 16

In Embodiment 14, except that 144.9 parts of the paste of acrylic-urethane resin (A3) containing a carboxyl group (100 parts of the resin) was used instead of the paste of the acrylic-urethane resin (A2) containing a carboxyl group, the same processes were carried out as Embodiment 1. Thus, a DFR was prepared, and then stacked onto a rib-forming glass substrate and evaluated in the same manner.

EMBODIMENT 17

In Embodiment 13, except that 77.9 parts of the paste of the acrylic-urethane resin (A1) containing a carboxyl group and 77.6 parts of the paste of the acrylic-urethane resin (A2) were used as the acrylic-urethane resin containing a carboxyl group, and that, instead of 50.0 parts, 35.7 parts of the solution of the acrylic-urethane resin (B3-1) was used, the same processes were carried out as Embodiment 1. Thus, a DFR was prepared, and then stacked onto a rib-forming glass substrate and evaluated in the same manner.

EMBODIMENT 18

In Embodiment 13, except that the amount of (C) was changed from 5.0 parts to 3.0 parts without using (D), the same processes were carried out as Embodiment 1. Thus, a DFR was prepared, and then stacked onto a rib-forming glass substrate and evaluated in the same manner.

COMPARATIVE EXAMPLE 5

In Embodiment 13, except that the amount of the paste of the acrylic-urethane resin (A1) containing a carboxyl group was changed from 155.8 parts to 210.0 parts without using the solution of the acrylic-urethane resin (B3-1), the same processes were carried out as Embodiment 1. Thus, a DFR was prepared, and then stacked onto a rib-forming glass substrate and evaluated in the same manner.

COMPARATIVE EXAMPLE 6

In Embodiment 13, except that the amount of the solution of the acrylic-urethane resin (B3-1) was changed from 49.0 parts to 192.4 parts without using the paste of the acrylic-urethane resin (A1) containing a carboxyl group, the same processes were carried out as Embodiment 1. Thus, a DFR was prepared, and then stacked onto a rib-forming glass substrate and evaluated in the same manner.

The results of evaluation of the embodiments and comparative embodiments are shown in Table 3.

TABLE 3

|  | Sensitivity (mj/cm$^2$) | Resolution | Chemical resistance for developer | Sandblasting resistance | Stability |
|---|---|---|---|---|---|
| Ex. 13 | 200 | ○ | ○ | ○ | ○ |
| Ex. 14 | 250 | ○ | ○ | ○ | ○ |
| Ex. 15 | 300 | ○ | ○ | ○ | ○ |
| Ex. 16 | 250 | ○ | ○ | ○ | ○ |
| Ex. 17 | 250 | ○ | ○ | ○ | ○ |
| Ex. 18 | 900 | ○ | ○ | ○ | ○ |
| Comp. Ex. 5 | 350 | X | ○ | ○ | ○ |
| Comp. Ex. 6 | 250 | ○ | ○ | X | ○ |

The photosensitive resin composition of the present invention contains two kinds of particular acrylic-urethane resins containing carboxyl group ((A) and (B)); therefore, it is superior in sensitivity, resolution, chemical resistance for developer, sandblasting resistance, retaining stability, etc. so that it is effectively used for various sandblast applications, and in particular, is most effectively applied to sandblast used for formation of a barrier rib in plasma display.

And in the photosensitive resin composition of a particular acrylic-urethane resin (A) containing carboxyl group and a particular acrylic-urethane resin (B2) without an acid number are used in a combined manner; therefore, it is superior in sensitivity, resolution and retaining stability, and since it is particularly provided with a superior sandblasting resistance, it is effectively used for various sandblast applications, and in particular, is most effectively applied to sandblast processes for glass, ceramics, SiC, etc. that are carried out under severe conditions.

What is claimed is:

1. A photosensitive resin composition comprising: an acrylic-urethane resin (A) containing a carboxyl group represented by the following formula (1), which has an acid number in the range of 10 to 100 mg KOH/g; an acrylic-urethane resin (B) selected from the group consisting of an acrylic-urethane resin (B1) represented by the following formula (3), an acrylic-urethane resin (B2) represented by the following formula (5) and an acrylic-urethane resin (B3) represented by the following formula (6); and a photo-polymerization initiator (C);

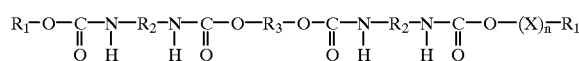

wherein X represents a structure represented by the following formula (2), $R_1$ represents a urethane-bond remaining group of a compound having one or two ethylenically unsaturated groups and one hydroxyl group, $R_2$ represents both ends of urethane-bond remaining groups of diisocyanate compound, $R_3$ represents both ends of urethane remaining groups of 2,2-bis(hydroxymethyl)propionic acid or 2,2-bis(hydroxymethyl)butanoic acid, and n represents a positive integer of not more than 20;

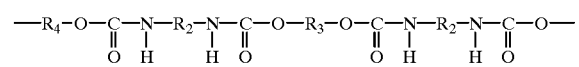

wherein $R_4$ represents polyol or polyester polyol having an average molecular weight of 500 to 10000;

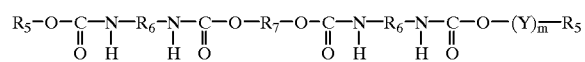

wherein Y represents a structure represented by the following formula (4), $R_5$ represents a urethane-bond remaining group of a compound having not less than one ethylenically unsaturated group and one hydroxyl group, $R_6$ represents both ends of urethane-bond remaining groups of diisocyanate compound, $R_7$ represents a urethane-bond remaining group of a polyol compound having a molecular weight of not more than 200 with no acid number, and m represents a positive integer of not more than 20;

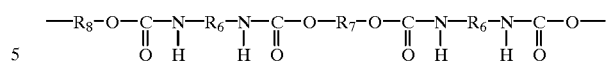

wherein $R_8$ represents polyol or polyester polyol having an average molecular weight of 500 to 10000;

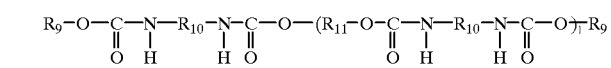

wherein $R_9$ represents a urethane-bond remaining group of a compound having not less than one ethylenically unsaturated group and one hydroxyl group, $R_{10}$ represents both ends of urethane-bond remaining groups of diisocyanate compound, $R_{11}$ represents polyol or polyester polyol having an average molecular weight of 500 to 10000, and l represents a positive integer of not more than 20;

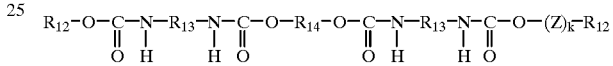

wherein Z represents a structure represented by the following formula (7), $R_{12}$ represents a urethane-bond remaining group of a compound having not less than three ethylenically unsaturated groups and one hydroxyl group, $R_{13}$ represents both ends of urethane-bond remaining groups of diisocyanate compound, $R_{14}$ represents both ends of urethane remaining groups of 2,2-bis(hydroxymethyl)propionic acid or 2,2-bis(hydroxymethyl)butanoic acid, and k represents a positive integer of not more than 20;

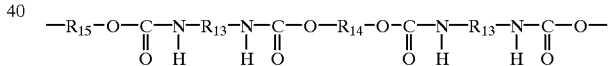

wherein $R_{15}$, represents polyol or polyester polyol having an average molecular weight of 500 to 10000, wherein a blending ratio of acrylic-urethane resin (A) containing a carboxyl group and acrylic-urethane resin (B) is in a range of 95:5 to 60:40, and the content of said photo-polymerzation initiator (C) is In a range of 0.1 to 20 parts by weight based on 100 parts by weight of (A) and (B).

2. The photosensitive resin composition according to claim 1, wherein said photo-polymerization initiator (C) is a derivative of hexaaryl biimidazole.

3. The photosensitive resin composition according to claim 2, further comprising a leuco dye (D).

4. The photosensitive resin composition according to claim 3, wherein the content of said leuco dye (D) is in a range of 0.05 to 3 parts by weight based on 100 parts by weight of said acrylic-urethane resin (A) containing carboxyl group and acrylic-urethane resin (B).

5. The photosensitive resin composition according to claim 1, further comprising a leuco dye (D).

6. The photosensitive resin composition according to claim 5 wherein the content of said leuco dye (D) is in a range of 0.05 to 3 parts by weight based on 100 parts by weight of said acrylic-urethane resin (A) containing carboxyl group and acrylic-urethane resin (B).

7. A photosensitive resin composition comprising: an acrylic-urethane resin (A) containing a carboxyl group represented by the following formula (1), which has an acid number in the range of 10 to 100 mg KOH/g; an acrylic-urethane resin (B) selected from the group consisting of an acrylic-urethane resin (B1) represented by the following formula (3), an acrylic-urethane resin (B2) represented by the following formula (5) and an acrylic-urethane resin (B3) represented by the following formula (6); and a photo-polymerization initiator (C);

(1)
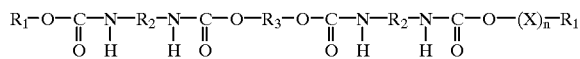

wherein X represents a structure represented by the following formula (2), $R_1$ represents a urethane-bond remaining group of a compound having one or two ethylenically unsaturated groups and one hydroxyl group, $R_2$ represents both ends of urethane-bond remaining groups of diisocyanate compound, $R_3$ represents both ends of urethane remaining groups of 2,2-bis(hydroxymethyl)propionic acid or 2,2-bis(hydroxymethyl)butanoic acid, and n represents a positive integer of not more than 20;

(2)
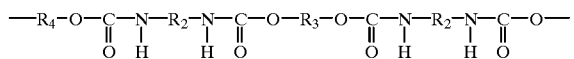

wherein $R_4$ represents polyol or polyester polyol having an average molecular weight of 500 to 10000;

(3)
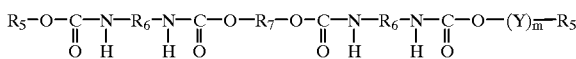

wherein Y represents a structure represented by the following formula (4), $R_5$ represents a urethane-bond remaining group of a compound having not less than one ethylenically unsaturated group and one hydroxyl group, $R_6$ represents both ends of urethane-bond remaining groups of diisocyanate compound, $R_7$ represents a urethane-bond remaining group of a polyol compound having a molecular weight of not more than 200 with no acid number, and m represents a positive integer of not more than 20;

(4)
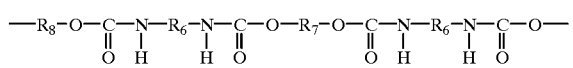

wherein $R_8$ represents polyol or polyester polyol having an average molecular weight of 500 to 10000;

(5)
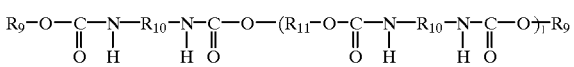

wherein $R_9$ represents a urethane-bond remaining group of a compound having not less than one ethylenically unsaturated group and one hydroxyl group, $R_{10}$ represents both ends of urethane-bond remaining groups of diisocyanate compound, $R_{11}$ represents polyol or polyester polyol having an average molecular weight of 500 to 10000, and l represents a positive integer of not more than 20;

(6)
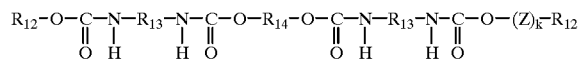

wherein Z represents a structure represented by the following formula (7), $R_{12}$ represents a urethane-bond remaining group of a compound having not less than three ethylenically unsaturated groups and one hydroxyl group, $R_{13}$ represents both ends of urethane-bond remaining groups of diisocyanate compound, $R_{14}$ represents both ends of urethane remaining groups of 2,2-bis(hydroxymethyl)propionic acid or 2,2-bis(hydroxymethyl)butanoic acid, and k represents a positive integer of not more than 20;

(7)
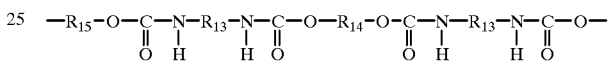

wherein $R_{15}$, represents polyol or polyester polyol having an average molecular weight of 500 to 10000, and a leuco dye (D).

8. The photosensitive resin composition according to claim 7 wherein that the content of said leuco dye (D) is in a range of 0.05 to 3 parts by weight based on 100 parts by weight of said acrylic-urethane resin (A) containing carboxyl group and acrylic-urethane resin (B).

9. A method for preparing a dry film resist comprising (a) applying to a base film a coating of a photosensitive resin composition comprising an acrylic-urethane resin (A) containing a carboxyl group represented by the following formula (1), which has an acid number in the range of 10 to 100 mg KOH/g; an acrylic-urethane resin (B) selected from the group consisting of an acrylic-urethane resin (B1) represented by the following formula (3), an acrylic-urethane resin (B2) represented by the following formula (5) and an acrylic-urethane resin (B3) represented by the following formula (6); and a photo-polymerization initiator (C);

(1)
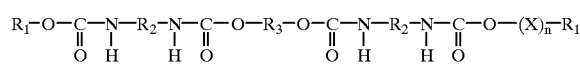

wherein X represents a structure represented by the following formula (2), $R_1$ represents a urethane-bond remaining group of a compound having one or two ethylenically unsaturated groups and one hydroxyl group, $R_2$ represents both ends of urethane-bond remaining groups of diisocyanate compound, $R_3$ represents both ends of urethane remaining groups of 2,2-bis(hydroxymethyl)propionic acid or 2,2-bis(hydroxymethyl)butanoic acid, and n represents a positive integer of not more than 20;

(2)

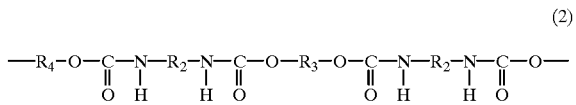

wherein R₄ represents polyol or polyester polyol having an average molecular weight of 500 to 10000;

(3)

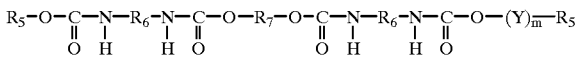

wherein Y represents a structure represented by the following formula (4), R₅ represents a urethane-bond remaining group of a compound having not less than one ethylenically unsaturated group and one hydroxyl group, R₆ represents both ends of urethane-bond remaining groups of diisocyanate compound, R₇ represents a urethane-bond remaining group of a polyol compound having a molecular weight of not more than 200 with no acid number, and m represents a positive integer of not more than 20;

(4)

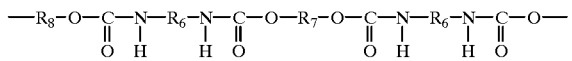

wherein R₈ represents polyol or polyester polyol having an average molecular weight of 500 to 10000;

(5)

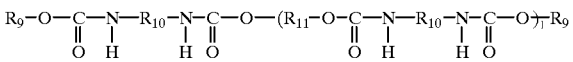

wherein R₉ represents a urethane-bond remaining group of a compound having not less than one ethylenically unsaturated group and one hydroxyl group, R₁₀ represents both ends of urethane-bond remaining groups of diisocyanate compound, R₁₁ represents polyol or polyester polyol having an average molecular weight of 500 to 10000, and l represents a positive integer of not more than 20;

(6)

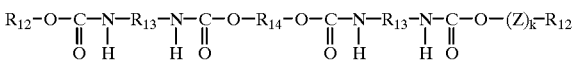

wherein Z represents a structure represented by the following formula (7), R₁₂ represents a urethane-bond remaining group of a compound having not less than three ethylenically unsaturated groups and one hydroxyl group, R₁₃ represents both ends of urethane-bond remaining groups of diisocyanate compound, R₁₄ represents both ends of urethane remaining groups of 2,2-bis(hydroxymethyl)propionic acid or 2,2-bis(hydroxymethyl)butanoic acid, and k represents a positive integer of not more than 20;

(7)

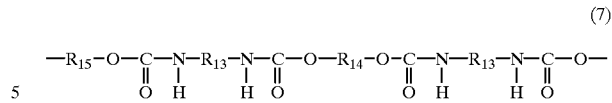

wherein R₁₅ represents polyol or polyester polyol having an average molecular weight of 500 to 10000, (b) forming a layer of the photosensitive resin composition; and (c) applying a protective film to the surface of the layer.

10. The method of claim 9, wherein the photo-polymerization initiator (C) is a derivative of hexaaryl biimidazole.

11. The method of claim 10, photosensitive resin composition further includes a leuco dye (D).

12. The method of claim 11, wherein the content of said leuco dye (D) is in q range of 0.05 to 3 parts by weight based on 100 parts by weight of said acrylic-urethane resin (A) containing carboxyl group and acrylic-urethane resin (B).

13. The method of claim 9, wherein the photosensitive resin composition further includes a leuco dye (D).

14. The method of claim 13, wherein the content of said leuco dye (D) is in a range of 005 to 3 parts by weight based on 100 parts by weight of aid acrylic-urethane resin (A) containing carboxyl group and acrylic-urethane resin (B).

15. The method of claim 9, wherein the photosensitive resin composition includes the acrylic-urethane resin (A) containing a carboxyl group and acrylic-urethane resin (B) in a blending ratio of 95:5 to 60:40, and the content of said photo-polymerization initiator (C) is in a range of 0.1 to 20 parts by weight based on 100 parts by weight of (A) and (B).

16. The method of claim 15, wherein the photosensitive resin composition further includes a leuco dye (D).

17. The method of claim 16, wherein the content of said leuco dye (D) is in a range of 0.05 to 3 parts by weight based on 100 parts by weight of said acrylic-urethane resin (A) containing carboxyl group and acrylic-urethane resin (B).

18. A photosensitive resin composition comprising: an acrylic-urethane resin (A) containing a carboxyl group represented by the following formula (1), which has an acid number in the range of 10 to 100 mg KOH/g; an acrylic-urethane resin (B1) represented by the following formula (3); and a photo-polymerization initiator (C);

(1)

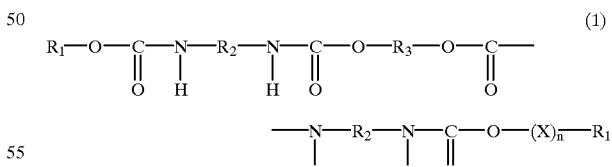

wherein X represents a structure represented by the following formula (2), R₁ represents a urethane-bond remaining group of a compound having one or two ethylenically unsaturated groups and one hydroxyl group, R₂ represents both ends of urethane-bond remaining groups of diisocyanate compound, R₃ represents both ends of urethane remaining groups of 2,2-bis(hydroxymethyl) propionic acid or 2,2-bis(hydroxymethyl)butanoic acid, and n represents a positive integer of not more than 20;

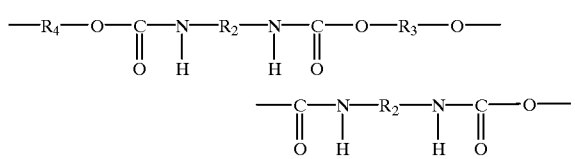

(2)

wherein $R_4$ represents polyol or polyester polyol having an average molecular weight of 500 to 10000;

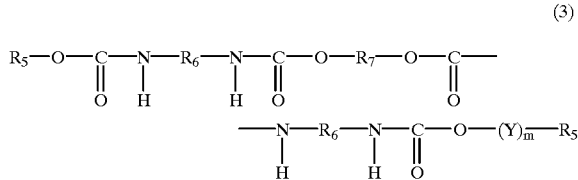

(3)

wherein Y represents a structure represented by the following formula (4), $R_5$ represents a urethane-bond remaining group of a compound having not less than one ethylenically unsaturated group and one hydroxyl group, $R_6$ represents both ends of urethane-bond remaining groups of diisocyanate compound, $R_7$ represents a urethane-bond remaining group of a polyol compound having a molecular weight of not more than 200 with no acid number, and m represents a positive integer of not more than 20;

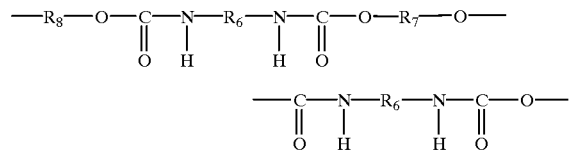

(4)

wherein $R_8$ represents polyol or polyester polyol having an average molecular weight of 500 to 10000.

19. A photosensitive resin composition comprising: an acrylic-urethane resin (A) containing a carboxyl group represented by the following formula (1), which has an acid number in the range of 10 to 100 mg KOH/g; an acrylic-urethane resin (B3) represented by the following formula (6); and a photo-polymerization initiator (C);

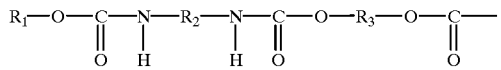

(1)

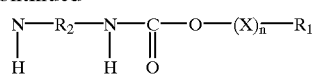

wherein X represents a structure represented by the following formula (2), $R_1$ represents a urethane-bond remaining group of a compound having one or two ethylenically unsaturated groups and one hydroxyl group, $R_2$ represents both ends of urethane-bond remaining groups of diisocyanate compound, $R_3$ represents both ends of urethane remaining groups of 2,2-bis(hydroxymethyl) propionic acid or 2,2-bis(hydroxymethyl)butanoic acid, and n represents a positive integer of not more than 20;

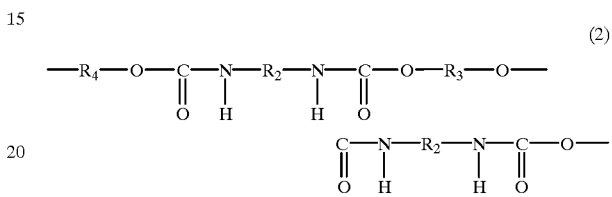

(2)

wherein $R_4$ represents polyol or polyester polyol having an average molecular weight of 500 to 10000;

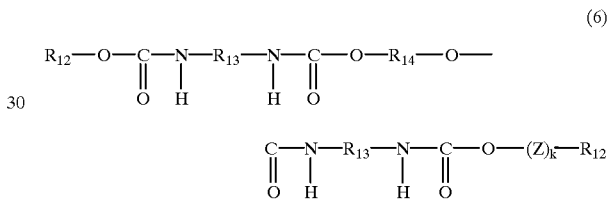

(6)

wherein Z represents a structure represented by the following formula (7), $R_{12}$ represents a urethane-bond remaining group of a compound having not less than three ethylenically unsaturated groups and one hydroxyl group, $R_{13}$ represents both ends of urethane-bond remaining groups of diisocyanate compound, $R_{14}$ represents both ends of urethane remaining groups of 2,2-bis(hydroxymethyl) propionic acid or 2,2-bis(hydroxymethyl)butanoic acid, and k represents a positive integer of not more than 20;

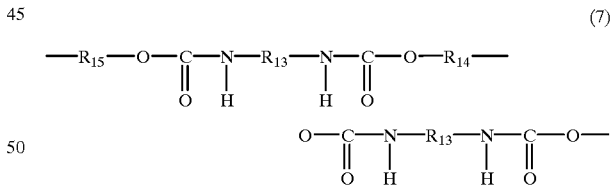

(7)

wherein $R_{15}$, represents polyol or polyester polyol having an average molecular weight of 500 to 10000.

* * * * *